(12) United States Patent
Wu et al.

(10) Patent No.: US 10,128,312 B2
(45) Date of Patent: Nov. 13, 2018

(54) NON-VOLATILE MEMORY DEVICE

(71) Applicant: Samsung Electronics Co., Ltd., Suwon-si (KR)

(72) Inventors: Zhe Wu, Suwon-si (KR); Jeong Hee Park, Hwaseong-si (KR); Dong Ho Ahn, Hwaseong-si (KR); Jin Woo Lee, Seoul (KR); Hee Ju Shin, Seoul (KR); Ja Bin Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/485,594

(22) Filed: Apr. 12, 2017

(65) Prior Publication Data
US 2018/0040669 A1  Feb. 8, 2018

(30) Foreign Application Priority Data

Aug. 3, 2016  (KR) .......................... 10-2016-0098876

(51) Int. Cl.
*H01L 27/24* (2006.01)
*H01L 23/528* (2006.01)
(Continued)

(52) U.S. Cl.
CPC ........ *H01L 27/2427* (2013.01); *H01L 23/528* (2013.01); *H01L 27/224* (2013.01); *H01L 27/2481* (2013.01); *H01L 43/02* (2013.01); *H01L 43/08* (2013.01); *H01L 43/10* (2013.01); *H01L 45/06* (2013.01); *H01L 45/08* (2013.01);
(Continued)

(58) Field of Classification Search
CPC . H01L 27/2427; H01L 45/06; H01L 45/1233; H01L 45/141; H01L 45/143; H01L 45/144

See application file for complete search history.

(56) References Cited

U.S. PATENT DOCUMENTS 4,621,032 A  11/1986 Deneufville et al.
7,277,313 B2 * 10/2007 Campbell ........... G11C 13/0011
                                                      365/105
(Continued)

FOREIGN PATENT DOCUMENTS

KR        10-1521321           3/2013

*Primary Examiner* — Allison P Bernstein
(74) *Attorney, Agent, or Firm* — Muir Patent Law, PLLC

(57) ABSTRACT

There is provided a non-volatile memory device which can enhance the reliability of a memory device by using an ovonic threshold switch (OTS) selection element including a multilayer structure. The non-volatile memory device includes a first electrode and a second electrode spaced apart from each other, a selection element layer between the first electrode and the second electrode, which is closer to the second electrode rather than to the first electrode, and which includes a first chalcogenide layer, a second chalcogenide layer, and a material layer disposed between the first and second chalcogenide layers. The first chalcogenide layer including a first chalcogenide material, and the second chalcogenide layer including a second chalcogenide material. A memory layer between the first electrode and the selection element layer includes a third chalcogenide material which is different from the first and second chalcogenide materials.

20 Claims, 16 Drawing Sheets

(51) Int. Cl.
  *H01L 27/22*   (2006.01)
  *H01L 43/02*   (2006.01)
  *H01L 43/08*   (2006.01)
  *H01L 43/10*   (2006.01)
  *H01L 45/00*   (2006.01)

(52) U.S. Cl.
  CPC ...... *H01L 45/1233* (2013.01); *H01L 45/1246* (2013.01); *H01L 45/1253* (2013.01); *H01L 45/143* (2013.01); *H01L 45/144* (2013.01); *H01L 45/146* (2013.01); *H01L 45/148* (2013.01)

(56) References Cited

U.S. PATENT DOCUMENTS

| | | |
|---|---|---|
| 8,654,560 B2 | 2/2014 | Deweerd et al. |
| 8,729,519 B2 * | 5/2014 | Redaelli .................. H01L 45/00 257/2 |
| 8,865,514 B2 | 10/2014 | Erbetta et al. |
| 8,901,532 B2 | 12/2014 | Lee et al. |
| 9,130,157 B2 * | 9/2015 | Gotti ........................ H01L 45/12 |
| 2008/0042119 A1 | 2/2008 | Sandoval et al. |
| 2013/0320286 A1 * | 12/2013 | Lee ...................... H01L 45/145 257/2 |
| 2015/0207066 A1 | 7/2015 | Ohba et al. |
| 2016/0056208 A1 * | 2/2016 | Pellizzer ................ H01L 45/06 257/5 |

* cited by examiner

NON-VOLATILE MEMORY DEVICE

CROSS-REFERENCE TO RELATED APPLICATION

This application claims priority from Korean Patent Application No. 10-2016-0098876 filed on Aug. 3, 2016 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a non-volatile memory device, and more specifically, to a non-volatile memory device including three-dimensional cross-point structure.

2. Description of the Related Art

Generally, a semiconductor memory device is categorized into a volatile memory device of which stored information is lost upon interruption of power supply, and a non-volatile memory device of which stored information can be continuously retained even with the interruption of power supply. For the non-volatile memory device, a flash memory device having stacked gate structure is mainly adopted. Meanwhile, a variable resistance memory device has been recently suggested as a new non-volatile memory device that will replace the flash memory device.

Because the semiconductor device is highly integrated, the variable resistance memory device of a cross point structure is being developed.

SUMMARY

A technical objective is to provide a non-volatile memory device which can enhance the reliability of a memory device by using an ovonic threshold switch (OTS) selection element including a multilayer film.

The objects according to the present disclosure are not limited to those set forth above and objects other than those set forth above will be clearly understood to a person skilled in the art from the following description.

According to an aspect of the exemplary embodiments of the herein described subject matter, there is provided a non-volatile memory device comprising a first electrode and a second electrode spaced apart from each other; a selection element layer between the first electrode and the second electrode, which is more adjacent to the second electrode rather than to the first electrode, and which includes a first chalcogenide layer and a second chalcogenide layer, the first chalcogenide layer including a first chalcogenide material, and the second chalcogenide layer including a second chalcogenide material; and a memory layer between the first electrode and the selection element layer, which includes a third chalcogenide material which is different from the first and second chalcogenide materials.

According to another aspect of the exemplary embodiments, there is provided a non-volatile memory device comprising a plurality of first conductive lines which extend in a first direction and are in parallel to one another; a plurality of second conductive lines which extend in a second direction different from the first direction, and are in parallel to one another; and a plurality of first memory cells disposed between the first conductive lines and the second conductive lines at points where the plurality of the first conductive lines and the plurality of the second conductive lines are intersecting each other, wherein each of the plurality of the first memory cells comprises a first selection element layer and a first memory layer, the first selection element layer includes a first chalcogenide layer having a first chalcogenide material and a second chalcogenide layer having a second chalcogenide material, and the first memory layer includes a third chalcogenide material which is different from the first chalcogenide material and the second chalcogenide material.

According to still another aspect of the exemplary embodiments, there is provided a non-volatile memory device comprising a first electrode and a second electrode spaced apart from each other; and a selection element layer and a memory layer disposed between the first electrode and the second electrode, wherein the selection element layer includes a first chalcogenide layer having a first chalcogenide material and a second chalcogenide layer having a second chalcogenide material, each of the first chalcogenide material and the second chalcogenide material includes ternary to senary chalcogenide materials having arsenic, or ternary to quinary selenium-based chalcogenide materials, and the memory layer includes a resistance change layer in which the resistance varies according to an electrical field.

According to still another aspect of the exemplary embodiments, there is provided a non-volatile memory device comprising a first electrode and a second electrode spaced apart from each other; a third electrode between the first electrode and the second electrode; a selection element layer between the first electrode and the third electrode; and a phase change memory layer between the second electrode and the third electrode, wherein the selection element layer includes a first chalcogenide layer having a first chalcogenide material and a second chalcogenide layer having a second chalcogenide material, the first chalcogenide material and the second chalcogenide material are not included in the phase change memory layer, and each of the first chalcogenide material and the second chalcogenide material includes a ternary to quinary chalcogenide materials having arsenic.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
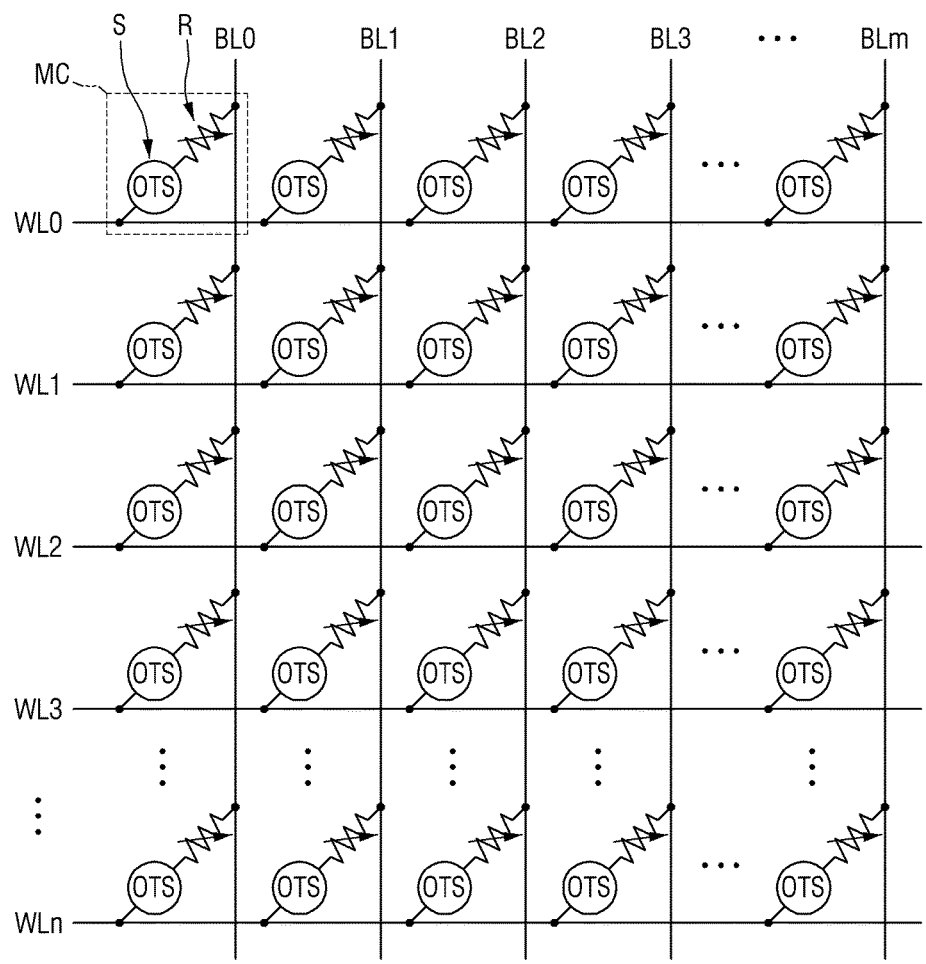
FIG. 1 is an exemplary circuit view illustrating a memory cell array of a non-volatile memory device according to some exemplary embodiments.

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed exemplary implementations are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinbelow, a non-volatile memory device according to some exemplary embodiments will be explained with reference to FIGS. 1 to 5.

Figure 2:
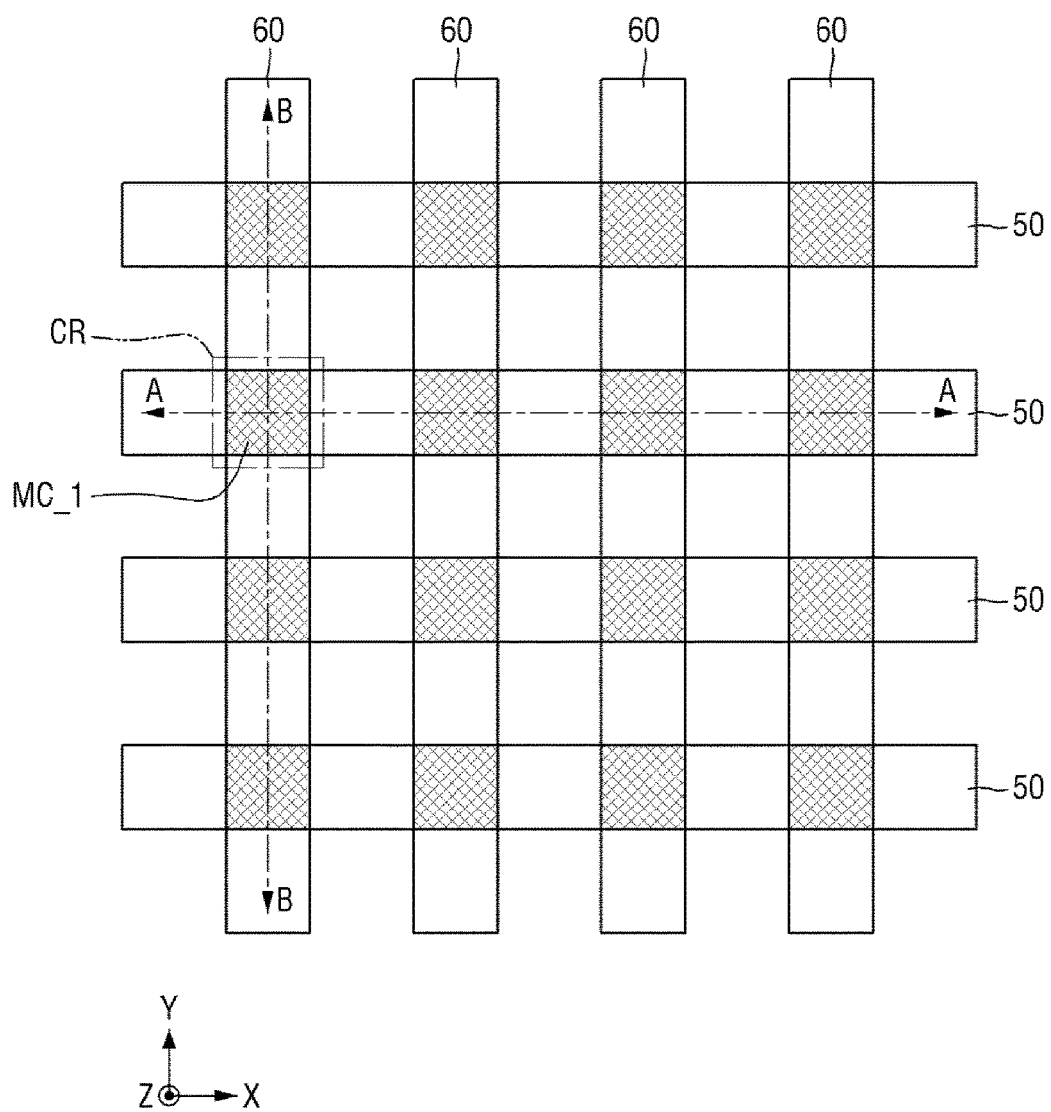
FIG. 2 is a layout view briefly illustrating a memory cell array of a non-volatile memory device according to some exemplary embodiments.
Figure 3:
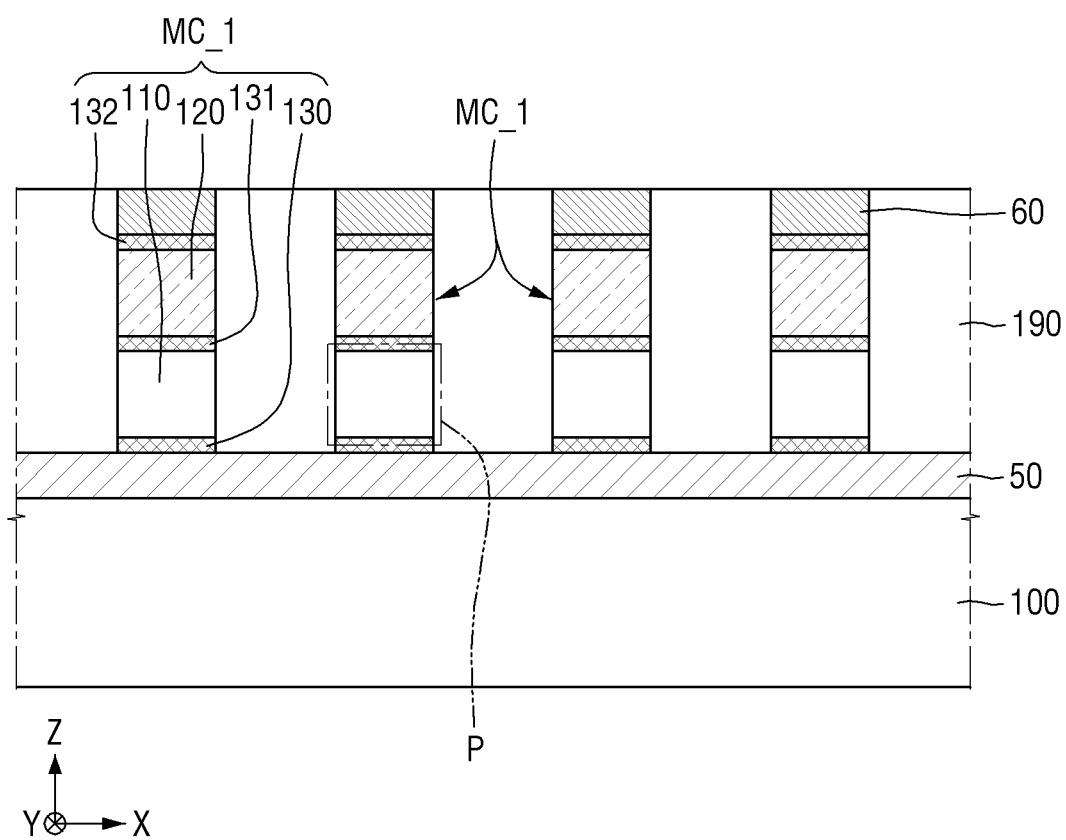
FIG. 3 is a cross sectional view taken on line A-A of FIG. 2.
Figure 4:
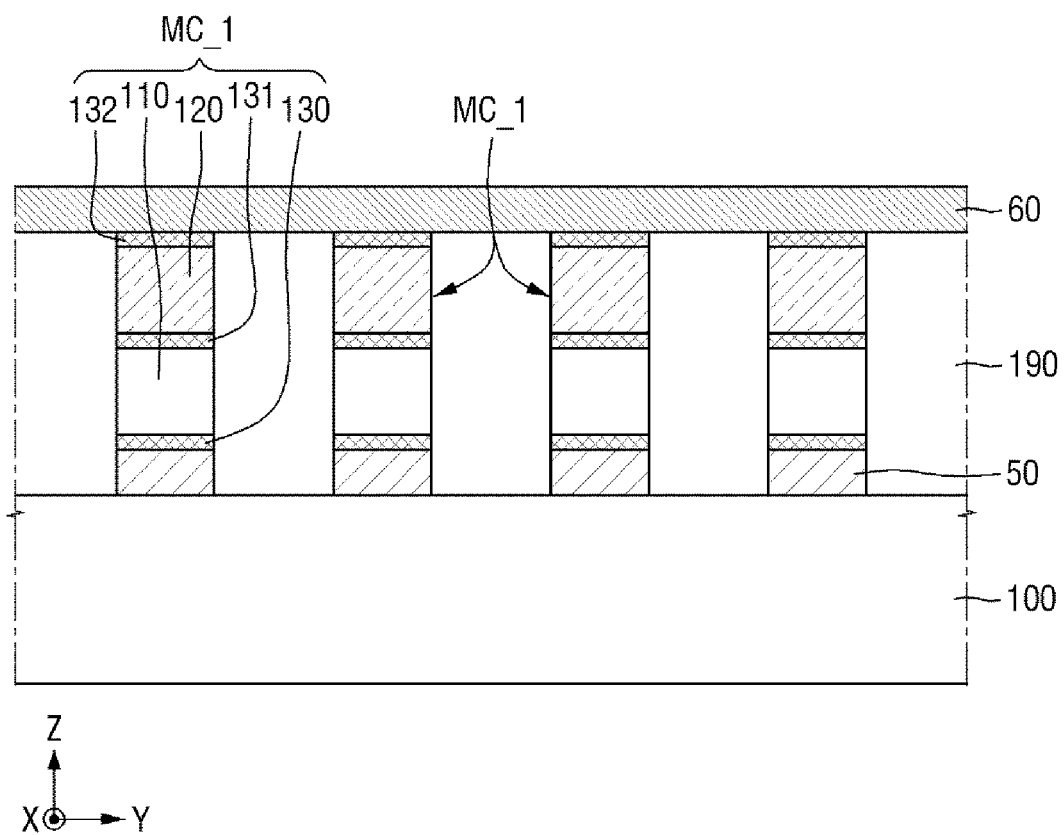
FIG. 4 is a cross sectional view taken on line B-B of FIG. 2.
Figure 5:
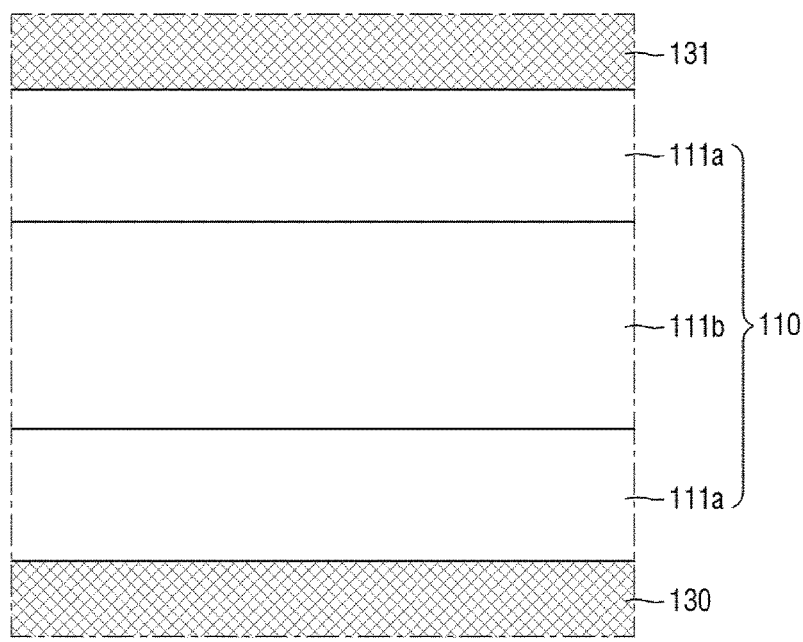
FIG. 5 is an enlargement view of an encircled section P of FIG. 3.

FIG. 1 is an exemplary circuit view illustrating a memory cell array of a non-volatile memory device according to some exemplary embodiments. FIG. 2 is a layout view briefly illustrating a memory cell array of a non-volatile memory device according to some exemplary embodiments. FIG. 3 is a cross sectional view taken on line A-A of FIG. 2. FIG. 4 is a cross sectional view taken on line B-B of FIG. 2. FIG. 5 is an enlargement view of an encircled section P of FIG. 3.

As shown in FIG. 1, the memory cell array 40 may be a two-dimensional memory. When the memory cell array 40 is composed of multi-layers, the memory cell array 40 may be a three-dimensional memory.

The memory cell array 40 may include a plurality of word lines WL0-WLn, a plurality of bit lines BL0-BLm, and a plurality of memory cells MC. A number of the word lines WL, a number of the bit lines BL, and a number of the memory cells MC may be variously modified according to an exemplary embodiment. Further, a set of the memory cells that can be accessed by a same word line simultaneously may be defined as a page.

In the non-volatile memory device according to some exemplary embodiments, a plurality of the memory cells MC may each include a variable resistance element R and a selection element S. Herein, the variable resistance element R may be referred to as a variable resistor (alternatively, variable resistance material), and the selection element S may be referred to as a switching element.

In the non-volatile memory element according to some exemplary embodiments, the selection element S may be an ovonic threshold switch (OTS) selector including a chalcogenide compound.

For example, the variable resistance element R may be connected between one of a plurality of the bit lines BL0-BLm and the selection element S, and the selection element S may be connected between the variable resistance element R and one of a plurality of the word lines WL0-WLn.

However, it may not be limited thereto; the selection element S may be connected between one of a plurality of the bit lines BL0-BLm and the variable resistance element R, and the variable resistance element R may be connected between the selection element R and one of a plurality of the word lines WL0-WLn.

The selection element S may be connected between any one of a plurality of the word lines WL0-WLn and the variable resistance element R, and may control the current supply to the variable resistance element R according to the voltage applied to the connected word lines and bit lines.

As shown in FIGS. 2 to 5, the non-volatile memory device according to some exemplary embodiments may include a plurality of first conductive lines 50, a plurality of second conductive lines 60, and a plurality of first memory cells MC_1.

A plurality of the first conductive lines 50 and a plurality of the second conductive lines 60 may be formed on a substrate 100. A plurality of the first conductive lines 50 may be formed with spacing apart from a plurality of the second conductive lines 60.

A plurality of the first conductive lines 50 may extend in parallel to one another in a first direction X. A plurality of the second conductive lines 60 may extend in parallel to one another in a second direction Y intersecting with the first direction X.

FIG. 2 illustrates that the first direction and the second direction are intersecting with each other by exemplifying the first direction as X direction and the second direction as Y direction, but the technical essence of the present disclosure is not limited thereto. That is, the first direction and the second direction are in any directions as long as these are intersecting with each other.

A plurality of the first conductive lines 50 and a plurality of the second conductive lines 60 may constitute a plurality of the word lines and a plurality of the bit lines, respectively.

According to an embodiment, a plurality of the first conductive lines 50 may constitute a plurality of the word lines, and a plurality of the second conductive lines 60 may constitute a plurality of the bit lines. According to another exemplary embodiment, a plurality of the first conductive lines 50 may constitute a plurality of the bit lines, and a plurality of the second conductive lines 60 may constitute a plurality of the word lines.

The substrate 100 may include a semiconductor wafer. According to some exemplary embodiments, the substrate 100 may include semiconductor elements such as Si and Ge, or compound semiconductor elements such as SiC, GaAs, InAs, and InP. According to other exemplary embodiments, the substrate 100 may include a silicon on insulator (SOI) structure or a silicon-germanium on insulator (SGOI) structure. For example, the substrate 100 may include a buried oxide layer (BOX). According to some exemplary embodiments, the substrate 100 may include a conductive region, for example, a well doped with impurity or a structure doped with impurity.

Although not illustrated, a structure including a plurality of gates, at least one interlayer insulating film, a plurality of contacts, and a plurality of wires may be interposed between the substrate 100 and the first conductive lines 50.

A plurality of the first conductive lines 50 and a plurality of the second conductive lines 60 may be each formed of metal, conductive metal nitride, conductive metal oxide, or a combination thereof.

According to some exemplary embodiments, a plurality of the first conductive lines 50 and a plurality of the second conductive lines 60 may be each formed of W, WN, Au, Ag, Cu, Al, TiAlN, Ir, Pt, Pd, Ru, Zr, Rh, Ni, Co, Cr, Sn, Zn, ITO, an alloy thereof, or a combination thereof.

According to yet other exemplary embodiments, a plurality of the first conductive lines 50 and a plurality of the second conductive lines 60 may each include a metal film and a conductive barrier film covering at least a portion of the metal film. The conductive barrier film may be, for example, formed of Ti, TiN, Ta, and TaN or a combination thereof, but is not limited thereto.

A plurality of the first conductive lines 50 and a plurality of the second conductive lines 60 may be constituted in a plurality of stripe patterns intersecting with one another.

A plurality of the first memory cells MC_1 (MC of FIG. 1) may be formed respectively at a plurality of the intersection points CR between a plurality of the first conductive lines 50 and a plurality of the second conductive lines 60. A plurality of the first memory cells MC_1 may form a cross point array structure.

A plurality of the first memory cells MC_1 may be each disposed between the first conductive lines 50 and the second conductive lines 60 intersecting one another, at a plurality of the intersection points CR between a plurality of the first conductive lines 50 and a plurality of the second conductive lines 60.

A plurality of the first memory cells MC_1 may be in pillar shapes extending in a third direction Z, respectively.

As illustrated in FIGS. 2 to 4, a cross section on X-Y plane of a plurality of the first memory cells MC_1 is roughly illustrated to be a rectangle shape; however, the technical essence of the present disclosure is not limited thereto, and various shapes of a cross-sectional structure may be obtained.

For example, a cross section on an X-Y plane of a plurality of the first memory cells MC_1 may have various shapes such as semicircle, semi-oval, trapezoid, triangle, and so on.

A plurality of the first memory cells MC_1 may respectively store digital information. A plurality of the first memory cells MC_1 may store digital information with the resistance change between various resistance states including a high resistance state and a low resistance state. A plurality of the first memory cells MC_1 may respectively include materials different from each other.

A plurality of the first memory cells MC_1 may respectively include a first memory layer 120, a first selection element layer 110, a first upper electrode 132, a first lower electrode 130, and a first intermediate electrode 131.

The first upper electrode 132 and the first lower electrode 130 may be spaced apart from each other. The first upper electrode 132 may be connected with one of a plurality of the second conductive lines 60, for example. The first lower electrode 130 may be connected with one of a plurality of the first conductive lines 50, for example.

The first selection element layer 110 and the first memory layer 120 may be disposed between the first upper electrode 132 and the first lower electrode 130.

The first selection element layer 110 may be disposed between the first upper electrode 132 and the first lower electrode 130. For example, the first selection element layer 110 may be formed closer to the first lower electrode 130 rather than to the first upper electrode 132. The first selection element layer 110 may be electrically connected with the first lower electrode 130.

The first memory layer 120 may be disposed between the first upper electrode 132 and the first selection element layer 110. For example, the first memory layer 120 may be formed closer to the first upper electrode 132 rather than to the first lower electrode 130. The first memory layer 120 may be electrically connected with the first upper electrode 132.

Although FIGS. 3 and 4 illustrate that the first selection element layer 110 may be disposed closer to the substrate 100 rather than to the first memory layer 120, the technical essence of the present disclosure is not limited thereto. Unlike the illustration, the first memory layer 120 may be also disposed closer to the substrate 100 rather than to the first selection element layer 110.

The first intermediate electrode 131 may be disposed between the first memory layer 120 and the first selection element layer 110. The first intermediate electrode 131 may be electrically connected with the first memory layer 120 and the first selection element layer 110, respectively.

For example, the selection element S of FIG. 1 may correspond to the first selection element layer 110, the first lower electrode 130, and the first intermediate electrode 131. The variable resistance element R of FIG. 1 may correspond to the first memory layer 120, the first upper electrode 132, and the first intermediate electrode 131.

The first lower electrode 130, the first intermediate electrode 131 and the first upper electrode 132 may each include metals such as tungsten (W), platinum (Pt), palladium (Pd), rhodium (Rh), ruthenium (Ru), iridium (Ir), copper (Cu), aluminum (Al), titanium (Ti), tantalum (Ta), and so on. Alternatively, the first lower electrode 130, the first intermediate electrode 131, and the first upper electrode 132 may each include metal nitride or metal silicon nitride such as titanium nitride (TiNx), titanium silicon nitride (TiSiNx), tungsten nitride (WNx), tungsten silicon nitride (WSiNx), tantalum nitride (TaNx), tantalum silicon nitride (TaSiNx), zirconium nitride (ZrNx), zirconium silicon oxide (ZrSiNx), and so on. Alternatively, the first lower electrode 130, the first intermediate electrode 131, and the first upper electrode 132 may each include a conductive oxide material of the above described material.

The first memory layer 120 may include a resistance change layer in which the resistance varies according to the electrical fields.

According to an exemplary embodiment, when the first memory layer 120 includes transition metal oxide, the non-volatile memory device of the present disclosure may be a resistance RAM (RRAM).

According to another exemplary embodiment, when the first memory layer 120 is formed of a phase change material in which the resistance varies according to the temperature, the non-volatile memory device of the present disclosure may be a phase change RAM (PRAM).

According to yet another exemplary embodiment, when the first memory layer 120 has a magnetic tunnel junction (MTJ) structure including two electrodes formed of a magnetic material, and a dielectric material disposed between the two magnetic electrodes, the non-volatile memory device of the present disclosure may be a magnetic RAM (MRAM).

According to some exemplary embodiments, the first memory layer 120 may be formed of various forms of compounds. According to other exemplary embodiments, the first memory layer 120 may be formed of a material in which impurity is added to various forms of compounds. According to yet other exemplary embodiments, the first memory layer 120 may include a resistance change layer, at least one barrier film covering at least a portion of the resistance change layer and/or at least one conductive film.

When the first memory layer 120 is formed of transition metal oxide, the transition metal oxide may include at least one metal selected from among Ta, Zr, Ti, Hf, Mn, Y, Ni, Co, Zn, Nb, Cu, Fe, or Cr. For example, the transition metal oxide may be formed in a single layer or multi layers formed of at least one selected from among $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, or $Fe_2O_{3-x}$. In the materials exemplified above, x and y may be respectively selected within a range of $0 \leq x \leq 1.5$ and $0 \leq y \leq 0.5$, but the exemplary embodiments described herein are not limited thereto.

When the first memory layer 120 is formed of a phase change material in which the resistance state changes with Joule heat generated from the applied voltage, the phase change material may be formed of various types of materials such as compounds of two elements such as GaSb, InSb, InSe, SbTe, and GeTe, compounds of three elements such as GST(GeSbTe), GeBiTe, GaSeTe, InSbTe, $SnSb_2Te_4$, and InSbGe, and compounds of four elements such as AgInSbTe, (GeSn)SbTe, GeSb(SeTe), $Te_{81}Ge_{15}Sb_2S_2$ and so on. Further, in order to enhance the characteristics of the first memory layer 120, the phase change material described above may be doped with nitrogen (N), silicon (Si), carbon (C) or oxygen (O).

Further, when the first memory layer 120 has an MTJ structure, the MTJ structure may include a magnetized fixed layer, a magnetized free layer, and a tunnel barrier interposed therebetween. The tunnel barrier may be formed of an oxide of any one material selected from among Mg, Ti, Al, MgZn, and MgB, but not limited hereto.

In a following description, the first memory layer 120 is mainly described as including a phase change material in which the resistance state varies with Joule heat.

The selection element (S of FIG. 1) including the first selection element layer 110, the first lower electrode 130, and the first intermediate electrode 131 may be an electrical current adjustment element that can control the flow of electrical current. For example, the selection element S may control the flow of electrical current so that the first memory layer 120 can be modified into an amorphous state or a crystalline state. That is, the selection element S may play the role of a memory switch, which modifies the state of the first memory layer 120 into either on state or off state.

In FIG. 5, the first selection element layer 110 may include two or more layers of the chalcogenide layer. For example, the first selection element layer 110 may include a first chalcogenide layer 111a and a second chalcogenide layer 111b.

The first chalcogenide layer 111a may include a first chalcogenide material, and the second chalcogenide layer 111b may include a second chalcogenide material.

In an exemplary embodiment, each of the first chalcogenide material and the second chalcogenide material may include a chalcogenide material including arsenic (As). Each of the first chalcogenide material and the second chalcogenide material may include, for example, at least one among selenium (Se), tellurium (Te), and sulfur (S), at least one among silicon (Si), germanium (Ge), bismuth (Bi), indium (In), gallium (Ga) and aluminum (Al), and arsenic (As).

For example, the first chalcogenide material and the second chalcogenide material may include at least one among ternary compounds including arsenic (As), germanium (Ge), and selenium (Se), quaternary compounds including arsenic (As), germanium (Ge), selenium (Se), and silicon (Si), quaternary compounds including arsenic (As), germanium (Ge), tellurium (Te), and silicon (Si), quinary compounds including arsenic (As), germanium (Ge), selenium (Se), tellurium (Te) and silicon (Si), and senary compounds including arsenic (As), germanium (Ge), selenium (Se), tellurium (Te), silicon (Si) and sulfur (S), but not limited hereto.

In another exemplary embodiment, each of the first chalcogenide material and the second chalcogenide material may include the selenium (Se)-based chalcogenide material. Each of the first chalcogenide material and the second chalcogenide material may include, for example, at least one of tellurium (Te), sulfur (S), silicon (Si), germanium (Ge), bismuth (Bi), indium (In), gallium (Ga), and aluminum (Al) and selenium (Se).

For example, each of the first chalcogenide material and the second chalcogenide material may include one among ternary selenium-based chalcogenide materials, quaternary selenium-based chalcogenide materials and quinary selenium-based chalcogenide materials, but the herein described exemplary embodiment are not limited thereto.

For example, the first chalcogenide material and the second chalcogenide material may be different materials from each other. The expression "different materials" as used herein indicates that elements constituting the first chalcogenide material are different from elements constituting the second chalcogenide material.

For example, when the first chalcogenide material is a quaternary compound including arsenic (As), germanium (Ge), selenium (Se), and silicon (Si), and the second chalcogenide material is a quaternary compound including arsenic (As), germanium (Ge), tellurium (Te), and silicon (Si), the first chalcogenide material may be different from the second chalcogenide material.

For another example, the first chalcogenide material may be same as the second chalcogenide material. However, the stoichiometry of the first chalcogenide material may be different from the stoichiometry of the second chalcogenide material.

For example, the first chalcogenide material and the second chalcogenide material may be ternary compounds including arsenic (As), germanium (Ge) and selenium (Se). That is, elements included in the first chalcogenide material and the second chalcogenide material may be, identically, arsenic (As), germanium (Ge), and selenium (Se).

A chemical formula of the first chalcogenide material may be $Ge_aAs_bSe_c$, and a chemical formula of the second chalcogenide material may be $Ge_dAs_eSe_f$. Herein, a, b, c, d, e, and f may be a natural number greater than 1.

Herein, "different stoichiometry" indicates that a is different from d, b is different from e, or c is different from f. That is, "different stoichiometry" indicates that a combination ratio between the elements included in the first chalcogenide material is different from a combination ratio between the elements included in the second chalcogenide material.

For another example, the first chalcogenide material and the second chalcogenide material may be same materials as each other. Further, the stoichiometry of the first chalcogenide material and the stoichiometry of the second chalcogenide material may be same as each other. However, a deposition condition for the first chalcogenide material may be different from a deposition condition for the second chalcogenide material. Herein, "deposition condition" may be a deposition method or a process condition for the same deposition method.

For example, a chalcogenide material may be formed by using a physical vapor deposition (PCD) or a chemical vapor deposition (CVD).

The chalcogenide material may represent different characteristic from each other according to which deposition method is used to deposit the chalcogenide even when the same stoichiometry is obtained. Further, even when the first chalcogenide material and the second chalcogenide material are deposited by using a same deposition method, a process condition depositing the first chalcogenide layer 111a may be different from a process condition depositing the second chalcogenide layer 111b. In this case, the first chalcogenide material and the second chalcogenide material may represent different characteristic from each other.

Additionally, even when the first chalcogenide layer 111a and the second chalcogenide layer 111b are contacted with each other, the films between the first chalcogenide layer 111a and the second chalcogenide layer 111b may be distinguished.

In the non-volatile memory device according to some exemplary embodiments, the first chalcogenide material and the second chalcogenide material included in the first selection element layer 110 may not be included in the first memory layer 120. That is, the chalcogenide materials included in the first selection element layer 110 may not be included in the first memory layer 120.

When the first memory layer 120 includes a third chalcogenide material as a phase change memory layer, the third chalcogenide material may be different from the first chalcogenide material included in the first chalcogenide layer 111a and the second chalcogenide material included in the second chalcogenide layer 111b.

At least one among the first chalcogenide layer 111a and the second chalcogenide layer 111b may be doped with at least one among carbon (C), nitrogen (N), and boron (B). That is, at least one among the first chalcogenide layer 111a and the second chalcogenide layer 111b may be doped with at least one of carbon (C), nitrogen (N), and boron (B).

For example, one of the first chalcogenide layer 111a and the second chalcogenide layer 111b may be doped with at least one among carbon (C), nitrogen (N), and boron (B). For example, when the first chalcogenide layer 111a is doped with at least one of carbon (C), nitrogen (N), and boron (B), the second chalcogenide layer 111b may not be doped with an impurity. On the contrary, when the second chalcogenide layer 111b is doped with at least one of carbon (C), nitrogen (N), and boron (B), the first chalcogenide layer 111a may not be doped with an impurity.

For another example, the first chalcogenide layer 111a and the second chalcogenide layer 111b may be doped with at least one of carbon (C), nitrogen (N), and boron (B). The first chalcogenide layer 111a and the second chalcogenide layer 111b may be doped with the same impurity. However, a concentration of the impurity doped on the first chalcogenide layer 110 may be different from a concentration of the impurity doped on the second chalcogenide layer 111b.

For another example, the impurity doped on the first chalcogenide layer 111a may be different from the impurity doped on the second chalcogenide layer 111b.

As illustrated in FIG. 5, the first selection element layer 110 may be formed such that the first chalcogenide layer 111a is disposed above and under with reference to the second chalcogenide layer 111b. The first selection element layer 110 may include three chalcogenide layers.

The first chalcogenide layer 111a may be disposed between the second chalcogenide layer 111b and the first lower electrode 130 and between the second chalcogenide layer 111b and the first intermediate electrode 131. The first chalcogenide layer 111a and the second chalcogenide layer 111b may contact each other.

For example, the first chalcogenide layer 111a adjacent to the first lower electrode 130 and the first intermediate electrode 131 may include a small $I_{off}$ material. Meanwhile, the second chalcogenide layer 111b disposed between the first chalcogenide layers 111a may include a material in which a deviation ($\Delta V_{th}$) of the threshold voltage is small.

As a result, the first selection element layer 110 may be designed such that $I_{off}$ is reduced on an interface of the first lower electrode 130 and the first intermediate electrode 131, while having little $V_{th}$ dispersion.

For example, the first chalcogenide material included in the first chalcogenide layer 111a may be a quaternary compound including arsenic (As), germanium (Ge), selenium (Se), and silicon (Si) while the second chalcogenide material included in the second chalcogenide layer 111b may be a quaternary compound including arsenic (As), germanium (Ge), tellurium (Te), and silicon (Si) or a quinary compound including arsenic (As), germanium (Ge), selenium (Se), tellurium (Te) and silicon (Si), however, the technical essence of the present disclosure is not limited hereto.

For another example, the first chalcogenide material included in the first chalcogenide layer 111a and the second chalcogenide material included in the second chalcogenide layer 111b may be quaternary compounds including arsenic (As), germanium (Ge), selenium (Se), and silicon (Si). However, at least one of carbon (C), nitrogen (N), and boron (B) may be doped on the second chalcogenide layer 111b, while the above described impurity may not be doped on the first chalcogenide layer 111a.

For another example, the first chalcogenide material included in the first chalcogenide layer 111a may be a quaternary compound including arsenic (As), germanium (Ge), selenium (Se), and silicon (Si), while the second chalcogenide material included in the second chalcogenide layer 111b may be a quaternary compound including arsenic (As), germanium (Ge), tellurium (Te), and silicon (Si) or a quinary compound including arsenic (As), germanium (Ge), selenium (Se), tellurium (Te), and silicon (Si). Further, at least one of carbon (C), nitrogen (N), and boron (B) may be doped on the second chalcogenide layer 111b while the above described impurity may not be doped on the first chalcogenide layer 111b.

A first interlayer insulating film 190 may be formed on the substrate 100. The first interlayer insulating film 190 may surround a sidewall of a plurality of the first memory cells MC_1 disposed between the first conductive line 50 and the second conductive line 60. The first interlayer insulating film 190 may include oxide films, for example, at least one of flowable oxide (FOX), tonen silazene (TOSZ), undoped silicate glass (USG), boro silicate glass (BSG), phospho silicate glass (PSG), borophospho silicate glass (BPSG), plasma enhanced tetra ethyl ortho silicate (PE-TEOS), fluoride silicate glass (FSG) and high density plasma (HDP). The first interlayer insulating film 190 may be a single layer, or may be stacked with a plurality of layers.

Figure 6:
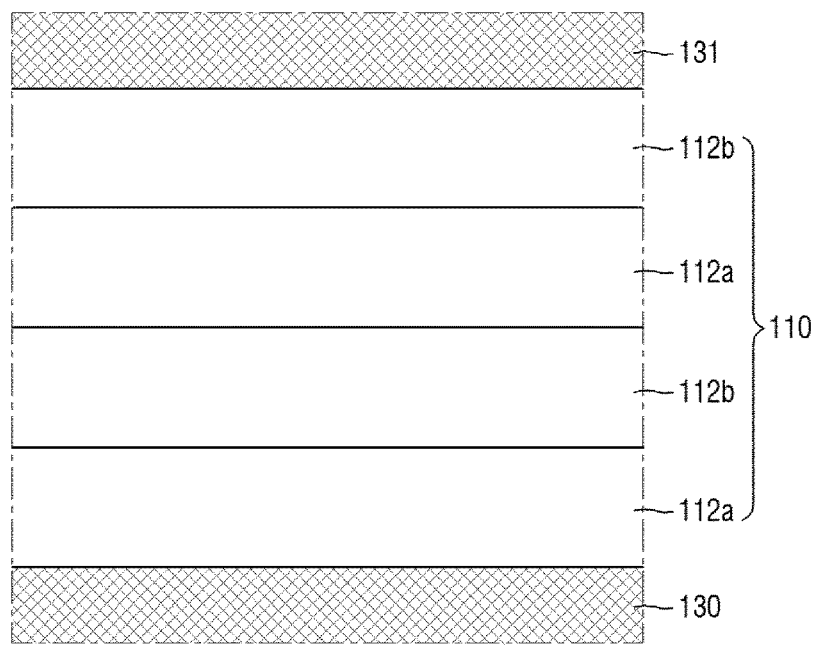
FIG. 6 is a view provided to explain a non-volatile memory device according to some exemplary embodiments.
Figure 7:
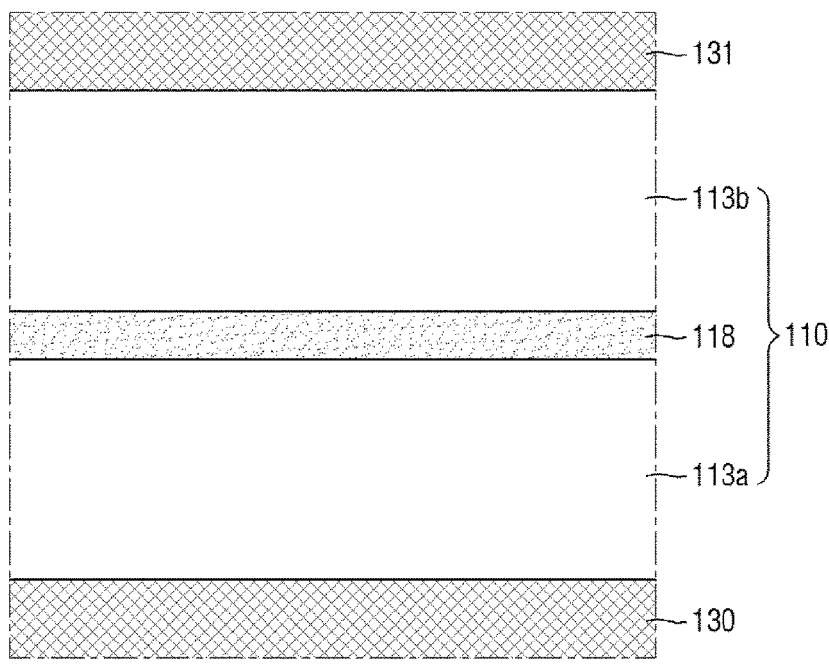
FIG. 7 is a view provided to explain a non-volatile memory device according to some exemplary embodiments.
Figure 8:
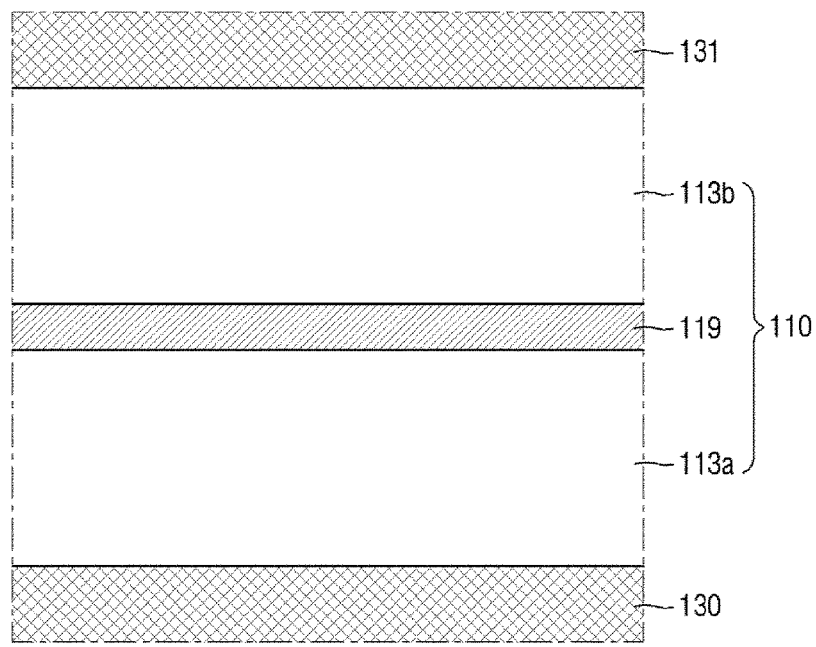
FIG. 8 is a view provided to explain a non-volatile memory device according to some exemplary embodiments.

FIG. 6 is a view provided to explain a non-volatile memory device according to some exemplary embodiments. FIG. 7 is a view provided to explain a non-volatile memory device according to some exemplary embodiments. FIG. 8 is a view provided to explain a non-volatile memory device according to some exemplary embodiments. For convenience of explanation, differences that are not explained above with reference to FIGS. 1 to 5 will be mainly explained below.

FIGS. 6 to 8 are enlargement views of an encircled section P of FIG. 3.

Further, explanation with respect to the first chalcogenide material included in the first chalcogenide layers 112a, 113a and the second chalcogenide material included in the second chalcogenide layers 112b, 113b may be same as or similar to the first chalcogenide material and the second chalcogenide material described with reference to FIGS. 1 to 5.

As shown in FIG. 6, in the non-volatile memory device according to some exemplary embodiments, the first selection element layer 110 may include one or more first chalcogenide layers 112a and one or more second chalcogenide layers 112b.

The first chalcogenide material included in the first chalcogenide layer 112a may be different from the second chalcogenide material included in the second chalcogenide layer 112b. Alternatively, the first chalcogenide material and the second chalcogenide material may be same materials as each other, but the stoichiometry may be different from each other.

When the first selection element layer 110 includes a plurality of the first chalcogenide layers 112a and a plurality of the second chalcogenide layers 112b, the first selection element layer 110 may include the first chalcogenide layers 112a and the second chalcogenide layers 112b stacked alternately.

In FIG. 6, a chalcogenide layer closest to the first lower electrode 130 among the first selection element layer 110 may be the first chalcogenide layer 112a, and a chalcogenide layer closest to the first intermediate electrode 131 among the first selection element layer 110 may be the second chalcogenide layer 112b, but the exemplary embodiments described herein are not limited thereto.

The first chalcogenide layer 112a and the second chalcogenide layer 112b which are adjacent to each other may be contacted with each other.

Although FIG. 6 illustrates that the first selection element layer 110 includes the two first chalcogenide layers 112a and the two chalcogenide layers 112b, the exemplary embodiments are not limited thereto.

The first selection element layer 110 may include one first chalcogenide layer 112a and one second chalcogenide layer 112b. Alternatively, the first selection element layer 110 may include three or more first chalcogenide layers 112a and three or more second chalcogenide layers 112b.

Further, although FIG. 6 illustrates that the first selection element layer 110 may include two different chalcogenide layers, i.e., the first chalcogenide layer 112a and the second chalcogenide layer 112b, the exemplary embodiments are not limited thereto.

The first selection element layer 110 may additionally include a third chalcogenide layer. A chalcogenide material included in the third chalcogenide layer may be different from the first chalcogenide material included in the first chalcogenide layer 112a and the second chalcogenide material included in the second chalcogenide layer 112b. Alternatively, a chalcogenide material included in the third chalcogenide layer may be same as the first chalcogenide material included in the first chalcogenide layer 112a, but the stoichiometry may be different from each other. Alternatively, a chalcogenide material included in the third chalcogenide layer may be same as the second chalcogenide material included in the second chalcogenide layer 112b, but the stoichiometry may be different from each other.

Because the first selection element layer 110 may include multiple chalcogenide layers, the viscous flow of the first selection element layer 110 may be receded. In a subsequent process performed after the first selection element layer 110, applied heat may restrain a void from being formed within the first selection element layer 110 or on a boundary between the electrodes 130, 131 and the first selection element layer 110. As a result, the reliability and performance of the non-volatile memory device can be enhanced.

As shown in FIG. 7, in the non-volatile memory device according to some exemplary embodiments, the first selection element layer 110 may include the first chalcogenide layer 113a, the second chalcogenide layer 113b, and a first insertion insulating layer 118.

The first insertion insulating layer 118 may be disposed between the first chalcogenide layer 113a and the second chalcogenide layer 113b. The first insertion insulating layer 118 may be contacted with the adjacent first chalcogenide layer 113a and second chalcogenide layer 113b.

The first insertion insulating layer 118 may play a role of an atomic diffusion barrier layer to prevent atom transfer between the first chalcogenide layer 113a and the second chalcogenide layer 113b. Further, the first insertion insulating layer 118 may reduce $I_{off}$ of the first memory cell MC_1. As a result, the non-volatile memory device according to some exemplary embodiments can be improved in terms of the endurance characteristic.

The first insertion insulating layer 118 may include insulating materials such as, for example, at least one of silicon oxide, silicon oxynitride, silicon nitride, aluminum oxide, and titanium oxide, but the exemplary embodiments are not limited thereto.

Because the characteristics of the selection element (S of FIG. 1) including the first selection element layer 110 may deteriorate when the first insertion insulating layer 118 has a high thickness, the thickness of the first insertion insulating layer 118 may be, for example, 50 Å or less.

The first chalcogenide material included in the first chalcogenide layer 113a may be different from the second chalcogenide material included in the second chalcogenide layer 113b. Alternatively, the first chalcogenide material and the second chalcogenide material may be same materials as each other, but the stoichiometry may be different from each other.

Additionally, the first chalcogenide material included in the first chalcogenide layer 113a may be same as the second chalcogenide material included in the second chalcogenide layer 113b, and the stoichiometry may be same as each other. A deposition condition for the first chalcogenide material and a deposition condition for the second chalcogenide material may be same as each other or different from each other.

Although FIG. 7 illustrates that the first selection element layer 110 includes the two chalcogenide layers, but this is provided for convenience of explanation, and not limited hereto.

Additionally, the first insertion insulating layer 118 is illustrated to be one layer, but the exemplary embodiments are not limited thereto. When the first selection element layer 110 includes n number of the chalcogenide layers, the first selection element layer 110 may include a certain number of the first insertion insulating layers 118, in which the certain number may be greater than 1 and less than n−1.

As shown in FIG. 8, in the non-volatile memory device according to some exemplary embodiments, the first selection element layer 110 may include the first chalcogenide layer 113a, the second chalcogenide layer 113b and a first conductive insertion layer 119.

The first conductive insertion layer 119 may be disposed between the first chalcogenide layer 113a and the second chalcogenide layer 113b. The first conductive insertion layer 119 may be contacted with the adjacent first chalcogenide layer 113a and second chalcogenide layer 113b.

The first conductive insertion layer 119 between the first chalcogenide layer 113a and the second chalcogenide layer 113b may play a role of the element diffusion barrier layer for preventing the atomic transfer of the first chalcogenide material and the second chalcogenide material. Further, the first conductive insertion layer 119 may reduce a threshold voltage $V_{th}$ of the selection element (S of FIG. 1). As a result, the non-volatile memory device according to some exemplary embodiments can be improved in terms of the endurance characteristic.

The first conductive insertion layer 119 may include a material that can prevent the diffusion of the first chalcogenide material and the second chalcogenide material. The first conductive insertion layer 119 may include a metallic conductive material such as at least one of tungsten, tungsten nitride, titanium, titanium nitride, tantalum and tantalum nitride, but the technical essence of the present disclosure may not be limited hereto.

A thickness of the first conductive insertion layer 119 may be 20 Å or greater, and 150 Å or less.

The first chalcogenide material included in the first chalcogenide layer 113a may be different from the second chalcogenide material included in the second chalcogenide layer 113b. Alternatively, the first chalcogenide material and the second chalcogenide material may be same materials as each other, but the stoichiometry may be different from each other.

Additionally, the first chalcogenide material included in the first chalcogenide layer 113a may be same as the second chalcogenide material included in the second chalcogenide layer 113b, and the stoichiometry may be same as each other. A deposition condition for the first chalcogenide material and a deposition condition for the second chalcogenide material may be same as each other or different from each other.

Although FIG. 8 illustrates that the first selection element layer 110 includes the two chalcogenide layers, this has been provided for convenience of explanation, and exemplary embodiment are not limited thereto.

Additionally, the first conductive insertion layer 119 is illustrated to be one unit, but the exemplary embodiments are not limited thereto. When the first selection element 110 includes n number of the chalcogenide layers, the first selection element layer 110 may include a certain number of the first conductive insertion layers 119 in which the certain number may be greater than 1 and less than n−1.

Figure 9:
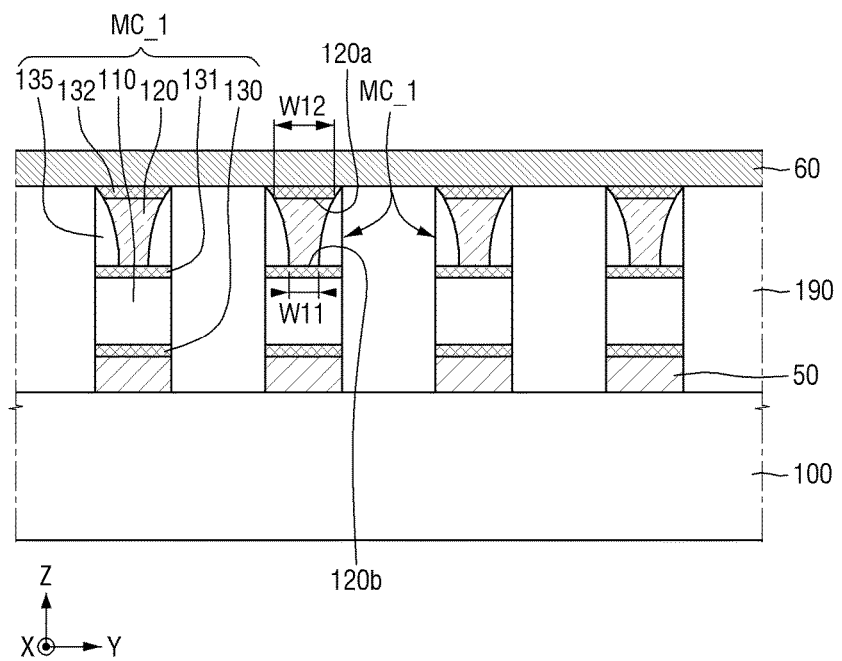
FIG. 9 is a view provided to explain a non-volatile memory device according to some exemplary embodiments.

FIG. 9 is a view provided to explain a non-volatile memory device according to some exemplary embodiments. For convenience of explanation, differences from the exemplary embodiments explained above with reference to FIGS. 1 to 5 will be mainly explained below.

FIG. 9 is a cross sectional view taken on line B-B of FIG. 2.

As shown in FIG. 9, in the non-volatile memory device according to some exemplary embodiments, the first memory cell MC_1 may further include a spacer 135 disposed on a sidewall of the first memory layer 120.

The spacer 135 may be disposed between the second conductive line 60 and the first intermediate electrode 131. The spacer 135 may be limitedly formed within a region where the first conductive line 50 and the second conductive line 60 are intersecting with each other.

The spacer 135 may include silicon nitride or silicon oxide, but not limited hereto.

Because the spacer 135 is formed in a manner in which it 135 is deposited into a liner shape and then only a sidewall portion is remained, an upper portion may be formed narrower than a lower portion. That is, a width of the spacer 135 may become narrower in an upward direction.

The first memory layer 120 may be formed by filling at least a portion of a space defined with the spacer 135. Because of the above process, a width of the first memory layer 120 may be increased in the direction farther away from the first intermediate electrode 131.

More specifically, a width of the first memory layer 120 in the second direction Y may increase farther away from the first intermediate electrode 131.

The first memory layer 120 may include a first surface 120a and a second surface 120b facing each other. The first surface 120a of the first memory layer 120 may be adjacent to the first upper electrode 132, and the second surface 120b of the first memory layer 120 may be adjacent to the first intermediate electrode 131 or the first selection element layer 110.

Herein, a width W12 of the first surface 120a of the first memory layer 120 in the second direction Y may be greater than a width W11 of the second surface 120b of the first memory layer 120 in the second direction Y.

Meanwhile, a cross sectional view taken on line of A-A of FIG. 2 corresponding to FIG. 9 may be substantially same as FIG. 3. That is, the spacer 135 may not be observed in a cross sectional view taken in the first direction X.

In the non-volatile memory device of FIG. 9, a size of the first surface 120a of the first memory layer 120 may be greater than a size of the second surface 120b of the first memory layer 120. That is, by disposing the spacer 135 on the first intermediate electrode 131, a size of the first surface 120a of the first memory layer 120 may be greater than a size of the second surface 120b of the first memory layer 120.

Although FIG. 9 illustrates that the first upper electrode 132 is formed within a space defined by the spacer 135, exemplary embodiments may not be limited thereto.

Figure 10:
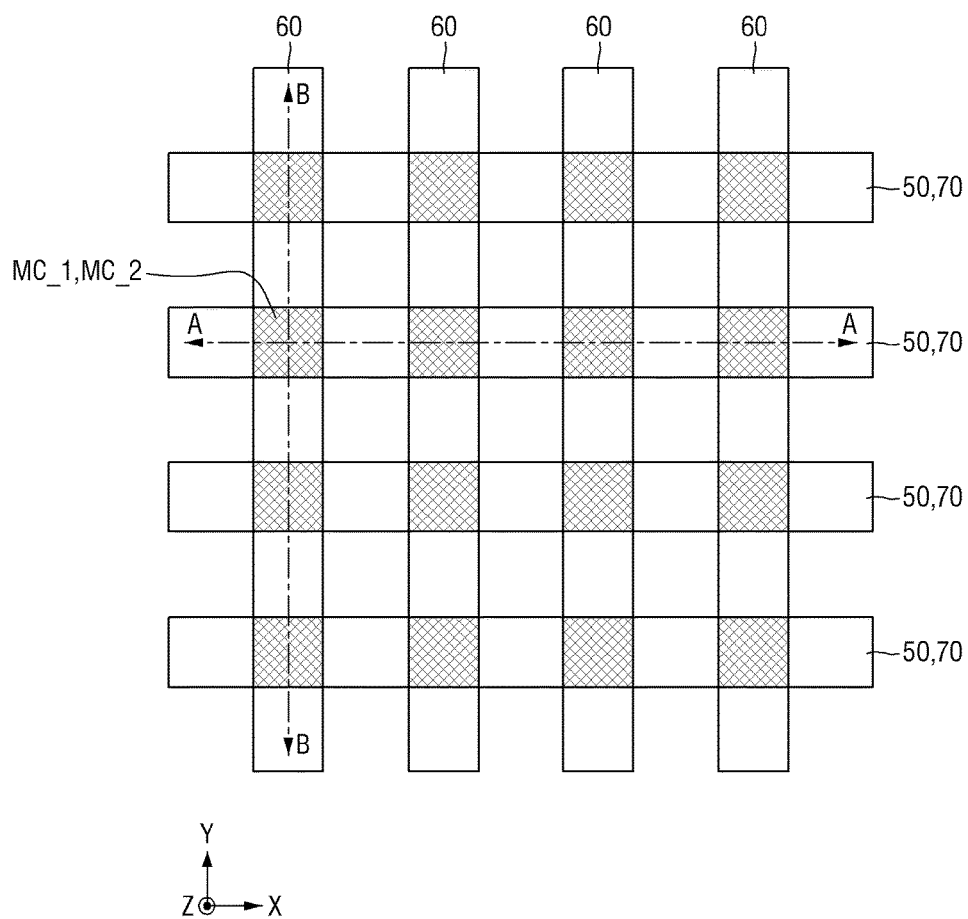
FIG. 10 is a layout view briefly illustrating a memory cell array of a non-volatile memory device according to some exemplary embodiments.
Figure 11:
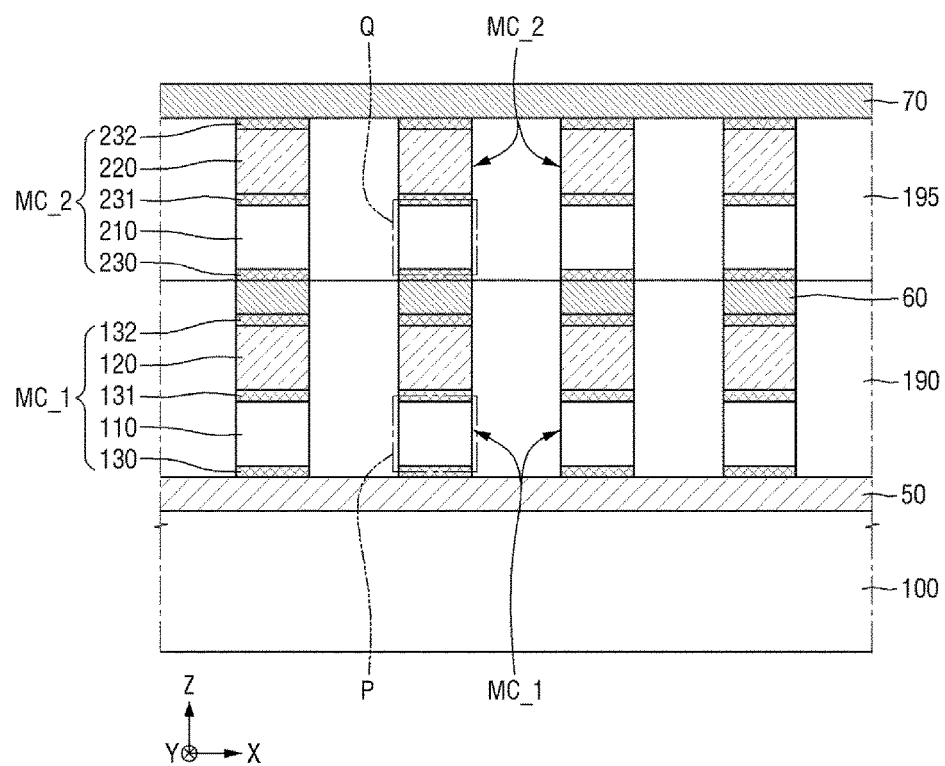
FIG. 11 is a cross sectional view taken on line A-A of FIG. 10.
Figure 12:
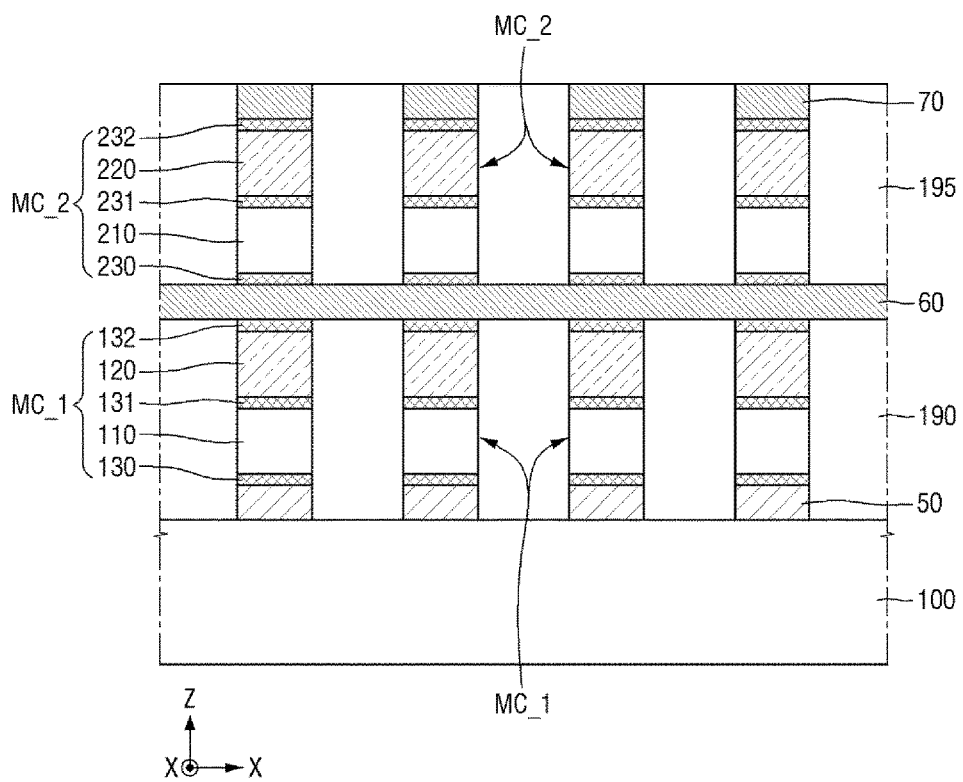
FIG. 12 is a cross sectional view taken on line B-B of FIG. 10.

FIG. 10 is a layout view briefly illustrating a memory cell array of a non-volatile memory device according to some exemplary embodiments. FIG. 11 is a cross sectional view taken on line A-A of FIG. 10. FIG. 12 is a cross sectional view taken on line B-B of FIG. 10. FIGS. 13 to 16 are enlargement views of an encircled section Q of FIG. 11. For convenience of description, a following description will be made based on difference from the description with respect to FIGS. 2 to 8.

The enlargement view of an encircled section P of FIG. 11 may be any one of FIGS. 5 to 8.

As shown in FIGS. 10 to 16, the non-volatile memory device according to some exemplary embodiments may include a plurality of third conductive lines 70 and a plurality of second memory cells MC_2.

A plurality of the third conductive lines 70 may be formed on a plurality of the second conductive lines 60. A plurality of the third conductive lines 70 may be formed to be spaced apart from a plurality of the second conductive lines 60. A plurality of the second conductive lines 60 may be disposed between a plurality of the third conductive lines 70 and a plurality of the first conductive lines 50.

A plurality of the third conductive lines 70 may extend in parallel to one another in the first direction X.

Although FIG. 10 illustrates that a plurality of the first conductive lines 50 and a plurality of the third conductive lines 70 extend to be parallel with one another and to be orthogonal to a direction in which a plurality of the second conductive lines 60 are extending, the exemplary embodiments may not be limited thereto.

A plurality of the first conductive lines 50, a plurality of the second conductive lines 60, and a plurality of the third conductive lines 70 may each constitute a plurality of the word lines or a plurality of the bit lines. According to an exemplary embodiment, a plurality of the first conductive lines 50 and a plurality of the third conductive lines 70 may each constitute a plurality of the bit lines, and a plurality of the second conductive lines 60 may each constitute common word lines. According to another exemplary embodiment, a plurality of the first conductive lines 50 and a plurality of the third conductive lines 70 may each constitute a plurality of the word lines, and a plurality of the second conductive lines 60 may each constitute common bit lines.

A plurality of the first memory cells MC_1 may be each disposed at a plurality of the intersection points between a plurality of the first conductive lines 50 and a plurality of the second conductive lines 60, and a plurality of the second memory cells MC_2 may be each disposed at a plurality of the intersection points between a plurality of the second conductive lines 60 and a plurality of the third conductive lines 70.

At a plurality of the intersection points between a plurality of the second conductive lines 60 and a plurality of the third conductive lines 70, a plurality of the second memory cells MC_2 may be each disposed between the second conductive lines 60 and the third conductive lines 70 which are intersecting each other.

A plurality of the second memory cells MC_2 may be a pillar shape extending in the third direction Z.

A plurality of the second memory cells MC_2 may each include a second memory layer 220, a second selection element layer 210, a second upper electrode 232, a second lower electrode 230, and a second intermediate electrode 231.

The second upper electrode 232 and the second lower electrode 230 may be spaced apart from each other. The second upper electrode 232 may be connected with one of a plurality of the third conductive lines 70, for example. The second lower electrode 230 may be connected with one of a plurality of the second conductive lines 60, for example.

The second selection element layer 210 and the second memory layer 220 may be disposed between the second upper electrode 232 and the second lower electrode 230.

The second selection element layer 210 may be disposed between the second upper electrode 232 and the second lower electrode 230. For example, the second selection element layer 210 may be formed more adjacent to the second lower electrode 230 rather than to the second upper electrode 232. The second selection element layer 210 may be electrically connected with the second lower electrode 230.

The second memory layer 220 may be disposed between the second upper electrode 232 and the second selection element layer 210. For example, the second memory layer 220 may be formed more adjacent to the second upper electrode 232 rather than to the second lower electrode 230. The second memory layer 220 may be electrically connected with the second upper electrode 232.

The second intermediate electrode 231 may be disposed between the second memory layer 220 and the second selection element layer 210. The second intermediate electrode 231 may be electrically connected with the second memory layer 220 and the second selection element layer 210, respectively.

The second memory layer 220 may include the resistance change layer in which the resistance varies according to the electrical field. The second memory layer 220 may include transition metal oxide, or include a phase change material in which the resistance varies according to the temperature, or have magnetic tunnel junction (MTJ) structure including two electrodes formed of a magnetic material, and a dielectric material disposed between the two magnetic electrodes.

Referring to FIGS. 13 to 16, the second selection element layer 210 may include two or more chalcogenide layers. For example, the second selection element layer 210 may include fourth chalcogenide layers 211a, 212a, 213a and fifth chalcogenide layers 211b, 212b, 213b.

The fourth chalcogenide layers 211a, 212a, 213a may include a fourth chalcogenide material, and the fifth chalcogenide layers 211b, 212b, 213b may include a fifth chalcogenide material.

Figure 13:
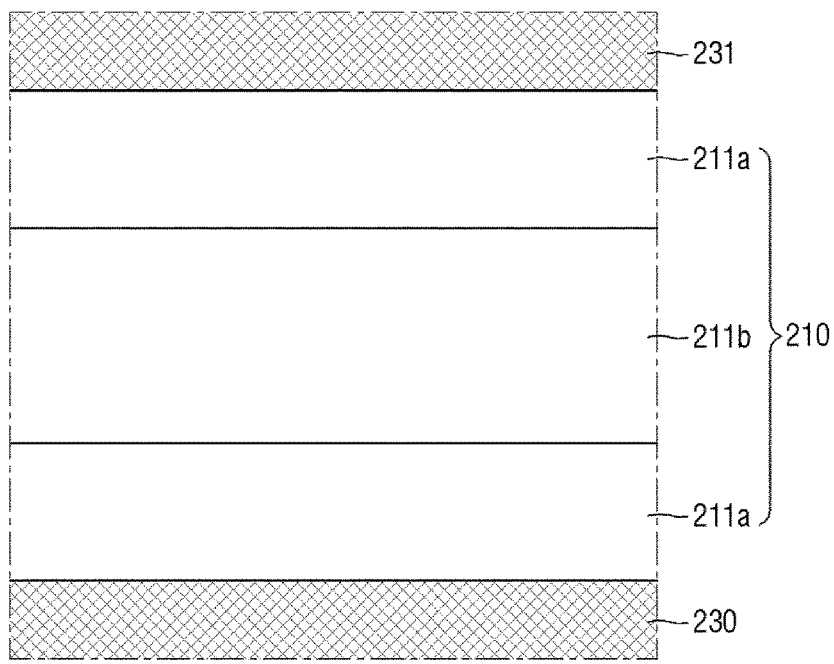
FIGS. 13 to 16 are enlargement views of an encircled section Q of FIG. 11.
Figure 14:
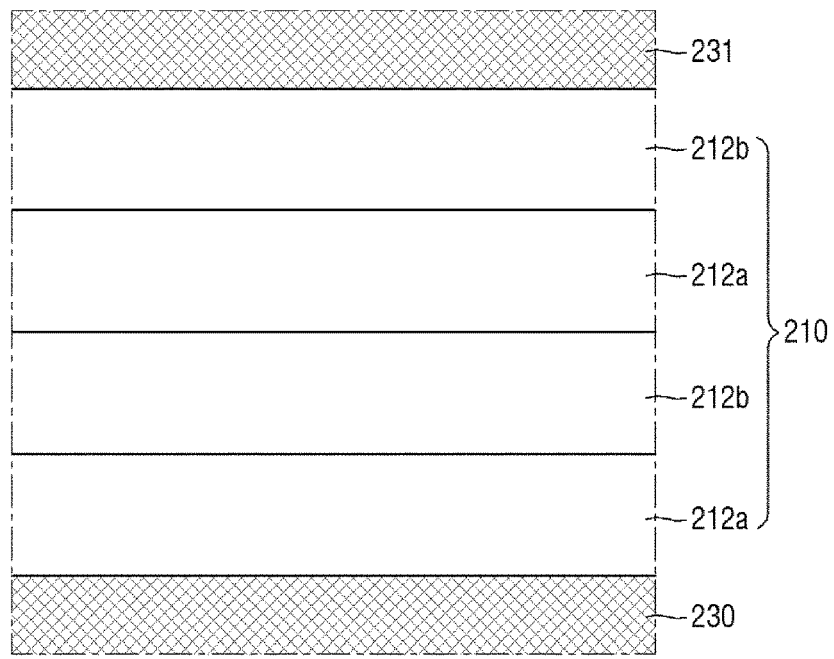

Explanations with respect to the fourth chalcogenide layer 211a and the fifth chalcogenide layer 211b of FIG. 13 may be substantially same as the descriptions of FIG. 5. Explanations with respect to the fourth chalcogenide layer 212a and the fifth chalcogenide layer 212b of FIG. 14 may be substantially same as the descriptions of FIG. 6. Further, explanations with respect to the fourth chalcogenide layer 213a and the fifth chalcogenide layer 213b of FIGS. 15 and 16 may be substantially same as the descriptions of FIGS. 7 and 8.

Figure 15:
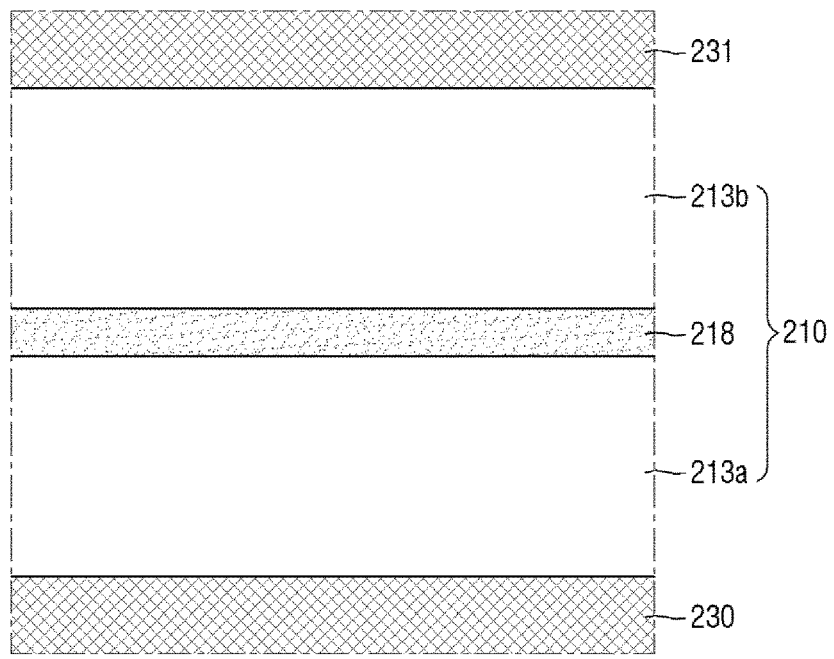
Figure 16:
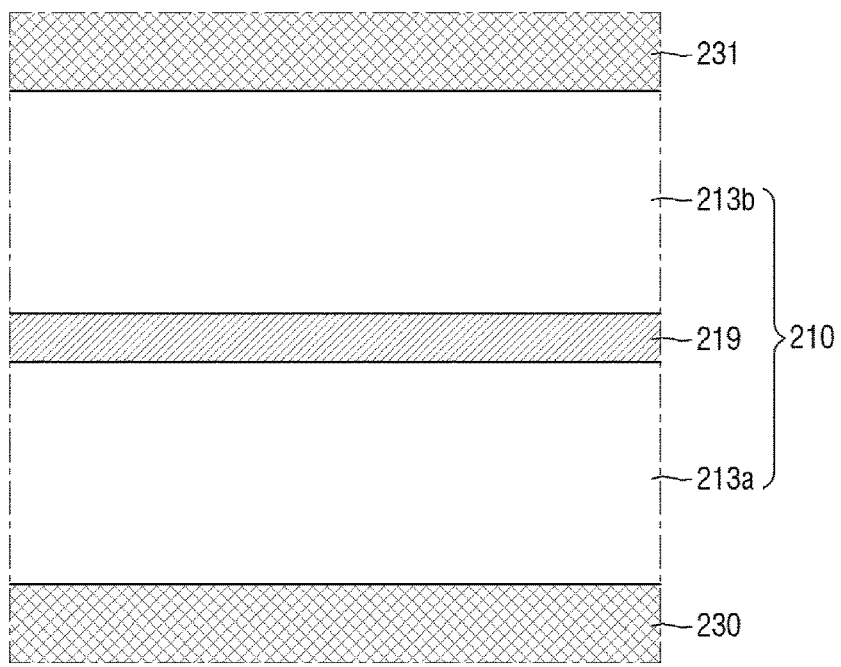

Referring to FIGS. 15 and 16, the second selection element layer 210 may further include a second insertion insulating film 218 or a second metallic insertion layer 219.

In the non-volatile memory device according to some exemplary embodiments, the fourth chalcogenide material and the fifth chalcogenide material included in the second selection element layer 210 may not be included in the second memory layer 220. That is, the chalcogenide materials included in the second selection element layer 210 may not be included in the second memory layer 220.

When the second memory layer 220 includes a sixth chalcogenide material as a phase change memory layer, the sixth chalcogenide material may be different from the fourth chalcogenide material included in the fourth chalcogenide layers 211a, 212a 213a and the fifth chalcogenide material included in the fifth chalcogenide layers 211b, 212b, 213b.

The structure of the first selection element layer 110 included in the first memory cell MC_1 may be one of the structures explained with reference to FIGS. 5 to 8. Further, the structure of the second selection element layer 210 included in the second memory cell MC_2 may be one of the structures explained with reference to FIGS. 13 to 16.

For example, the structure of the first selection element layer 110 included in the first memory cell MC_1 may be same as the structure of the second selection element layer 210 of the second memory cell MC_2. For another example, the structure of the first selection element layer 110 included in the first memory cell MC_1 may be different from the structure of the second selection element layer 210 of the second memory cell MC_2.

For another example, the structure of the first selection element layer 110 included in the first memory cell MC_1 may be same as the structure of the second selection element layer 210 included in the second memory cell MC_2, but the chalcogenide layer included in the first selection element layer 110 may be different from the chalcogenide layer of the second selection element layer 210. More specifically, the chalcogenide material included in the first selection element layer 110 may be different from the chalcogenide material included in the second selection element layer 210. Alternatively, the chalcogenide material included in the first selection element layer 110 may be same as the chalcogenide material included in the second selection element layer 210, but the stoichiometry may be different from each other. Further, the doping of the chalcogenide layer included in the first selection element layer 110 may be different from the doping of the chalcogenide layer included in the second selection element layer 210.

A second interlayer insulating film 195 may be formed on the first interlayer insulating film 190. The second interlayer insulating film 195 may surround sidewalls of a plurality of the second memory cells MC_2 disposed between the second conductive line 60 and the third conductive line 70.

Figure 17:
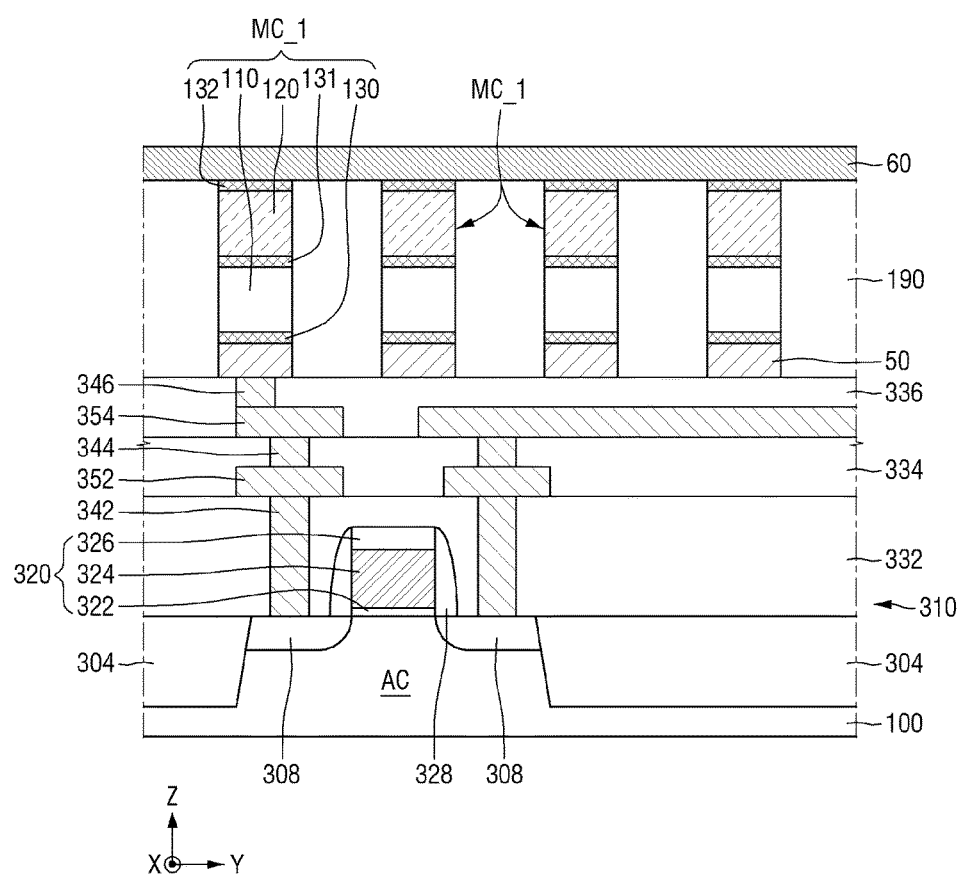
FIG. 17 is a view provided to explain a non-volatile memory device according to some exemplary embodiments.

FIG. 17 is a view provided to explain a non-volatile memory device according to some exemplary embodiments. For convenience of explanation, the overlapping with respect to FIGS. 2 to 5 will not be explained below.

FIG. 17 exemplifies a non-volatile memory device having a structure including a partial constitution of the non-volatile memory device explained with reference to FIGS. 2 to 8, and with an added lower structure 310 in which a transistor and a plurality of wires are included between the substrate 100 and the first conductive line 50. The integrated circuit device according to this exemplary embodiment may not be limited to the constitution exemplified in FIG. 17, and may be variously transformed and modified as will be readily recognized by those skilled in the art.

As shown in FIG. 17, a device isolating region 304 defining an active region AC may be formed on the substrate 100. The lower structure 310 may include a gate structure 320, a plurality of the interlayer insulating films 332, 334, 336, a plurality of contact plugs 342, 344, 346, and a plurality of wires 352, 354, which are formed on the active region AC of the substrate 100.

The gate structure 320 may include the gate insulating film 322, a gate 324, and an insulating capping layer 326, which are formed sequentially on the active region AC of the substrate 100. Both sidewalls of the gate structure 320 may be covered with a gate spacer 328. The gate insulating film 322 may include silicon oxide or metal oxide. The gate 324 may include polysilicon, metal, metal nitride doped with impurity, or a combination thereof. The insulating capping film 326 may be formed of a nitride film. The gate spacer 328 may be formed of an oxide film, a nitride film or a combination thereof.

A pair of impurity regions 308 may be formed on both sides of the gate structure 320 in the active region AC of the substrate 100. According to some exemplary embodiments, a pair of the impurity regions 308 may include N type or P type impurity. The gate structure 320 may constitute NMOS or PMOS transistor according to an impurity type included in a pair of the impurity regions 308.

The wire 352 may be electrically connected with the impurity regions 308 through the contact plug 342 penetrating the interlayer insulating film 332 covering the gate structure 320. Further, the wire 354 may be electrically connected with the wire 352 through the contact plug 344 penetrating the interlayer insulating film 334 covering the wire 352.

The wire 354 is covered with the interlayer insulating film 336, and a plurality of the first memory cells MC_1 are formed on the interlayer insulating film 336. The contact plug 346 may be formed to penetrate the interlayer insulating film 336 covering the wire 354. The first conductive line 50 on a lower portion of a plurality of the first memory cells MC_1 may be electrically connected with the wire 354 through the contact plug 346.

A plurality of the interlayer insulating films 332, 334, 336 may be formed of an oxide film. A plurality of the contact plugs 342, 344, 346 and a plurality of the wires 352, 354 may each include metal, conductive metal nitride, or a combination thereof. For example, metal may be selected among W, Al, Cu, and Ti, but not limited hereto.

In the non-volatile memory device of the present disclosure, the structure above the interlayer insulating film 336 may include the constitution of the memory cells MC_1, MC_2 exemplified in FIG. 9 or FIG. 12. Alternatively, included may be constitution of the non-volatile memory device having a structure transformed and modified from the memory cells MC_1, MC_2 exemplified within the technical idea of the present disclosure, instead of the constitution described with reference to FIGS. 1 to 16.

The constitution of the lower structure 310 in FIG. 17 is merely one exemplary embodiment, and may be variously transformed and modified as will be readily recognized by those skilled in the art. For example, the lower structure 310 may include a single layer of the wire structure, or multi-wire structure having three or more layers.

In concluding the detailed description, those skilled in the art will appreciate that many variations and modifications can be made to the preferred exemplary embodiments without substantially departing from the principles of the present inventive concept. Therefore, the disclosed preferred embodiments of the invention are used in a generic and descriptive sense only and not for purposes of limitation.

What is claimed is:

1. A non-volatile memory device, comprising:
a first electrode and a second electrode spaced apart from each other;
a selection element layer between the first electrode and the second electrode, which is disposed closer to the second electrode than to the first electrode, and which includes a first chalcogenide layer, a second chalcogenide layer, the first chalcogenide layer including a first chalcogenide material, and the second chalcogenide layer including a second chalcogenide material; and
a memory layer between the first electrode and the selection element layer, which includes a third chalcogenide material which is different from the first and second chalcogenide materials; and
wherein the selection element layer includes an insertion insulating layer between the first chalcogenide layer and the second chalcogenide layer.

2. The non-volatile memory device of claim 1, wherein the first chalcogenide material is different from the second chalcogenide material.

3. The non-volatile memory device of claim 2, wherein the first chalcogenide layer and the second chalcogenide layer are in contact with each other.

4. The non-volatile memory device of claim 1,
wherein the first chalcogenide material and the second chalcogenide material are the same material as each other, and
wherein a stoichiometry of the first chalcogenide material is different from a stoichiometry of the second chalcogenide material.

5. The non-volatile memory device of claim 1,
wherein the first chalcogenide material and the second chalcogenide material are the same material as each other,
wherein a stoichiometry of the first chalcogenide material is the same as a stoichiometry of the second chalcogenide material, and
wherein a deposition condition for the first chalcogenide material is different from a deposition condition for the second chalcogenide material.

6. The non-volatile memory device of claim 1, wherein each of the first chalcogenide material and the second chalcogenide material includes a chalcogenide material having arsenic (As).

7. The non-volatile memory device of claim 6, wherein at least one of the first chalcogenide layer and the second chalcogenide layer comprises at least one of a doped carbon, nitrogen, and boron.

8. The non-volatile memory device of claim 1, wherein each of the first chalcogenide material and the second chalcogenide material includes a selenium (Se) based chalcogenide material.

9. The non-volatile memory device of claim 1,
wherein the selection element layer includes a plurality of the first chalcogenide layers and a plurality of the second chalcogenide layers, and
wherein the first chalcogenide layers and the second chalcogenide layers are alternately stacked.

10. The non-volatile memory device of claim 1, wherein said insertion insulating layer includes at least one of silicon oxide, silicon oxynitride, silicon nitride, aluminum oxide, and titanium oxide.

11. A non-volatile memory device, comprising:
a plurality of first conductive lines which extend in a first direction and are in parallel to one another;
a plurality of second conductive lines which extend in a second direction different from the first direction, and are in parallel to one another; and
a plurality of first memory cells disposed between the first conductive lines and the second conductive lines at points where the plurality of the first conductive lines and the plurality of the second conductive lines are intersecting each other,
wherein each of the plurality of the first memory cells comprises a first selection element layer and a first memory layer,
wherein the first selection element layer includes a first chalcogenide layer having a first chalcogenide material and a second chalcogenide layer having a second chalcogenide material,
wherein the first memory layer includes a third chalcogenide material which is different from the first chalcogenide material and the second chalcogenide material,
wherein the first selection element layer includes an atomic diffusion barrier layer disposed between the first chalcogenide layer and the second chalcogenide layer, and
wherein the atomic diffusion barrier layer includes an insulating material.

12. The non-volatile memory device of claim 11, wherein each of the plurality of the first memory cells includes a first electrode disposed between the first memory layer and the first conductive lines, a second electrode disposed between the first selection element layer and the second conductive lines, and a third electrode disposed between the first memory layer and the first selection element layer.

13. The non-volatile memory device of claim 11, further comprising:
a plurality of third conductive lines which extend in a third direction different from the second direction and are in parallel to one another; and
a plurality of second memory cells disposed between the second conductive lines and the third conductive lines at points where the plurality of the second conductive lines and the plurality of the third conductive lines are intersecting each other,
wherein the plurality of the second conductive lines are disposed between the plurality of the first conductive lines and the plurality of the third conductive lines.

14. The non-volatile memory device of claim 13,
wherein each of the plurality of the second memory cells includes a second selection element layer and a second memory layer,
wherein the second selection element layer includes a fourth chalcogenide layer having a fourth chalcogenide material and a fifth chalcogenide layer having a fifth chalcogenide material,
wherein the second memory layer includes a phase change material, and
wherein the second memory layer does not include the fourth chalcogenide material and the fifth chalcogenide material.

15. The non-volatile memory device of claim 11, wherein a thickness of the atomic diffusion barrier layer is 20 Å or greater, and 150 Å or less.

16. The non-volatile memory device of claim 11, wherein a thickness of the atomic diffusion barrier layer is 50 Å or less.

17. The non-volatile memory device of claim 11, wherein said insulating material includes at least one of silicon oxide, silicon oxynitride, silicon nitride, aluminum oxide, and titanium oxide.

18. A non-volatile memory device, comprising:
first and second electrodes spaced apart from each other;
a selection element layer comprising at least two chalcogenide layers disposed between said first and second electrodes and comprising chalcogenide material, and at least one insertion layer disposed between said at least two chalcogenide layers; and
a memory layer disposed between the first and second electrodes comprising a chalcogenide material different from that of the at least two chalcogenide layers,
wherein said at least one insertion layer comprises a diffusion barrier layer, and
wherein the diffusion barrier layer includes an insulating material.

19. The non-volatile memory device of claim 18, further comprising a third electrode between the selection element layer and the memory layer.

20. The non-volatile memory device of claim 18, wherein said insulating material includes at least one of silicon oxide, silicon oxynitride, silicon nitride, aluminum oxide, and titanium oxide.

* * * * *